United States Patent [19]

Mori

[11] Patent Number: 4,610,031
[45] Date of Patent: Sep. 2, 1986

[54] RECEIVER INCLUDING SURFACE ACOUSTIC WAVE AMPLIFIER

[75] Inventor: Masaharu Mori, Tokyo, Japan

[73] Assignee: Clarion Co., Ltd., Tokyo, Japan

[21] Appl. No.: 623,808

[22] Filed: Jun. 22, 1984

[30] Foreign Application Priority Data

Jun. 23, 1983 [JP] Japan .................. 58-113324

[51] Int. Cl.⁴ .................. H04B 1/26; H03F 7/00
[52] U.S. Cl. .................. 455/263; 455/208; 455/341; 455/214; 330/4.9
[58] Field of Search .......... 455/258, 260, 263, 293, 455/311, 341, 208, 214; 330/4.5, 4.9, 5.5

[56] References Cited

U.S. PATENT DOCUMENTS

| | | | |
|---|---|---|---|
| 3,217,259 | 11/1965 | Kotzebue et al. | 455/260 |
| 3,784,916 | 1/1974 | Maurer | 455/341 |
| 4,426,732 | 1/1984 | Mori | 330/5.5 |
| 4,426,737 | 1/1984 | Mori | 455/260 |

Primary Examiner—Jin F. Ng
Attorney, Agent, or Firm—Flynn, Thiel, Boutell & Tanis

[57] ABSTRACT

A receiver includes a surface acoustic wave amplifier provided in a high frequency amplification stage and generating two outputs corresponding to acoustic waves which propagate through said amplifier in the opposite directions. One of the outputs is demodulated by a phase locked loop demodulator or by a frequency discriminator and is applied to and controls a voltage control oscillator. Frequency modulated components of an output from the voltage control oscillator is used to produce frequency modulated components of a pumping power for the surface acoustic wave amplifier.

7 Claims, 10 Drawing Figures

RECEIVER INCLUDING SURFACE ACOUSTIC WAVE AMPLIFIER

FIELD OF THE INVENTION

This invention relates to a receiver including a surface acoustic wave amplifier (hereinafter called "SAW amplifier") of a parametric amplification type provided in a high frequency amplification circuit.

BACKGROUND OF THE INVENTION

The present invention disclosed, in Japanese Patent Application No. 90649/1981, that a receiver including such a SAW amplifier is excellent in sensitivity and in noise suppression because such an amplifier serves as a narrow band tracking filter also for reception of an FM stereophonic broadcasting, for example, having a frequency band much wider than the pass band of the SAW amplifier.

The circuit arrangement of the above-introduced application, however, involves the following drawbacks.

(1) Since the SAW amplifier has narrow band amplification characteristics, the group delay is large and greatly varies with frequency. Due to this, signal distortion increases as the frequency deviation of the received FM wave increases and as the modulation frequency of the wave becomes higher, thus disabling tracking and reception of the signal in the worst case.

(2) Due to the large group delay, signal separation is extremely worsened.

(3) Since two outputs of the SAW amplifier which are derived from acoustic waves propagating in the opposite directions are used, two circuit lines respectively including frequency converters and IF amplifiers must be provided, thus inviting a complication of circuit arrangements and an increase of the fabrication cost.

The above-mentioned drawbacks (1) and (2) will occur if a closed tracking loop as disclosed in the prior art application includes therein a SAW device having characteristics shown in FIG. 1. The Figure shows the amplification ratio (solid line ) and the group delay (dotted line) of the SAW amplifier with respect to the frequency. When the pass band width at $-3$ dB is 10 kHz, the group delay is $40\mu$ sec at the center frequency and becomes smaller as it comes apart from the center frequency. Outside the pass band, the group delay represents a constant value (several $\mu$ sec) determined by the propagating velocity and distance of surface acoustic waves. Thus, the group velocity largely varies with frequency.

OBJECT OF THE INVENTION

It is therefore an object of the invention to provide a receiver with a lower distortion, wider tracking range and excellent signal separation by using only one of the outputs of the SAW amplifier.

SUMMARY OF THE INVENTION

To attain this object, the receiver according to the invention comprises a surface acoustic wave amplifier provided in the high frequency amplification stage, and utilizes one of outputs of the SAW amplifier corresponding to acoustic waves propagating in the opposite directions, so that the selected output of the SAW amplifier is demodulated by a phase locked loop demodulator or frequency discriminator. The demodulated output from the phase locked loop demodulator or from the frequency discriminator controls a voltage control oscillator, and frequency modulated components of the output from the oscillator is used to produce frequency modulated components of a pumping power for the SAW amplifier.

In one preferred embodiment of the invention, selected one of outputs of the SAW amplifier is frequency modulated by the output of the voltage control oscillator, and the frequency modulated output is applied to first equalizer circuit having transfer characteristics which differ from static transfer characteristics of the SAW amplifier both in amplitude and in phase, so that the output from the equalizer circuit is used as an input to the phase locked loop demodulator or to the frequency discriminator.

The receiver according to the invention further includes second equalizer provided between a phase comparator of the phase locked loop demodulator and the voltage control oscillator, or alternatively between the frequency discriminator and the voltage control oscillator. The second equalizer has an input which is divided into two circuit lines one of whcih is directly connected to an adder and the other is connected to the adder via a high frequency filter so that the adder adds the both inputs. In the preferred embodiment, the first equalizer is a trap circuit to reject undesired frequencies. Namely, the first equalizer comprises an input which is divided into two lines, two series capacitors provided in one of the lines, a resonance circuit connecting the intercapacitors point to the ground, a series resistor provided in the other line, an output uniting the two lines, and a parallel capacitor connected to the output in parallel with the two lines to bypass high frequency components.

DETAILED DESCRIPTION OF THE PREFERRED EMBODIMENTS

Figure 2:
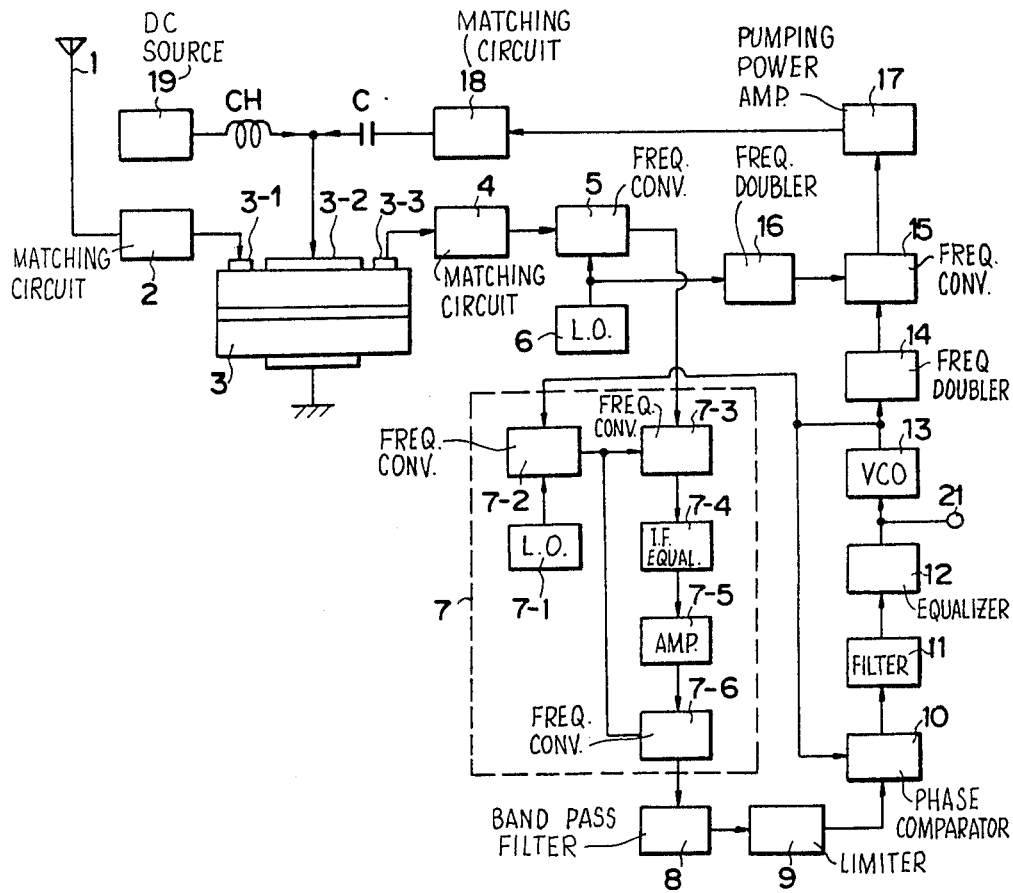
FIG. 2 is a block diagram of a receiver embodying the invention.

FIG. 2 is a block diagram of a receiver embodying the invention. Reference numeral 1 refers to an antenna, 2, 4 and 18 refer to matching circuits, 3 refers to a parametric surface acoustic wave amplifier, 3-1 and 3-3 refer to input and output electrodes, 3-2 refers to a pumping electrode, 5, 7-2, 7-3, 7-6 and 15 refer to frequency converters, 6 refers to first local oscillator, 7-1 refers to second local oscillator, 7 refers to a tracking equalizer, 7-4 refers to an IF equalizer, 7-5 refers to a tuned type amplifier, 8 refers to a band pass filiter, 9 refers to a limitter also operable as an amplifier, 10 refers to a phase comparator, 11 refers to a loop filter, 12 refers to an AF equalizer, 13 refers to a voltage control oscillator (VCO), 14 and 16 refer to frequency doublers, 17 refers to a pumping power amplifier, 19 refers to a dc voltage source, 21 refers to an output, CH refers to a choke coil, and C refers to a capacitor.

Referring to FIG. 2, static frequencies at various circuit elements with respect to an input frequency will be explained first. When an input having a freuqnecy $f_i$ is received by the antenna 1, two output signals propagating in the opposite directions are produced in the SAW amplifier 3. One of the outputs is picked up from the output electrode 3—3. The frequency of the selected output is $f_i$ irrespective of the pumping frequency. The frequency converter 5 produces an output with a frequency which is a difference between said frequency $f_i$ and a frequency $f_{L1}$ of the first local oscillator 6, namely, $$f_{IF1} = f_i - f_{L1} \tag{1}$$

The first oscillator frequency $f_{L1}$ is variable as in a usual superheterodyne receiver, so as to fix said $f_{IF1}$ constant. For example, when $f_i$ is 83 MHz, $f_{L1}$ is 72.3 MHz and $f_{IF1}$ is 10.7 MHz.

The VCO 13 produces outputs with a center frequency equal to $f_{LF1}$ and one of the outputs is mixed with a frequency $f_{L2}$ of the second local oscillator 7-1 by the frequency converter 7-2 which as the results produces an output with a frequency which is the difference between said frequencies $f_{IF1}$ and $f_{L2}$, namely, $$f_{L3} = f_{IF1} - f_{L2} \tag{2}$$

For example, $f_{L2}$ is 1 MHz, and $f_{L3}$ is 9.7 MHz.

The frequency converter 7-3 produces an output with a frequency which is the difference between the frequencies of the outputs from the frequency converters 7-2 and 5, namely, $$f_{IF2} = f_{L3} - f_{IF1} \tag{3}$$

In the embodiment illustrated, $f_{IF2}$ is 1 MHz. This output is frequency converted again in the frequency converter 7-6 to the frequency difference from the frequency $f_{L3}$ of the converter 7-2, namely, $$f_{IF1} = f_{L3} - f_{IF2} \tag{4}$$

Therefore, the phase comparator 10 is supplied with inputs with the same frequency $f_{IF1}$.

On the other hand, the output from the VCO 13 is doubled by the doubler 14 into $2f_{IF1}$, and is mixed by the frequency converter 15 with $2f_{L1}$ which is obtained from the output of the first local oscillator 6 by the doubler 16, namely, $$\begin{aligned} f_p &= 2f_{L1} + 2f_{I1} \\ &= 2(f_{L1} + f_{IF1}) \\ &= 2f_i \end{aligned} \tag{5}$$

The output $2f_i$ from the frequency converter 15 is power amplified by the pumping power amplifier 17 and is applied to the pump electrode 3-2 via the matching circuit 18. Since a SAW amplifier in general effects the maximum amplification of an input signal by pumping with a frequency twice the input frequency, said frequency relations are preferable.

The next explanation is made about, in addition to dynamic frequency relations, the tracking action and the equalizing actions of the IF equalizer 7-4 and of the AF equalizer 12 which are the subject matter of the invention. Here is used the angular frequency $\omega$ to express frequencies.

Assume now that the voltage of an FM signal received by the antenna 1 is expressed by $$v_i = e \times p[j\{\omega_i t + \theta_i(t)\}] \tag{6}$$

where
$\omega_i$: input center frequency $$\theta_i(t) = \int \Delta\omega\mu(t)dt \tag{7}$$

$\mu(t)$: source signal
$\Delta\omega$: frequency deviation.

The received signal with voltage $v_i$ is applied to the input electrode 3-1 via the matching circuit 2. The output electrode 3-3 provides an amplified output. As to relation between the output from the electrode 3-3 and the instantaneous frequency of a signal applied to the pumping electrode 3-2, the following should be noted. Since the instantaneous frequency $\omega_{is}(t)$ is $$\omega_{is}(t) = \omega_i + \Delta\omega\mu(t) \tag{8}$$

the best pumping frequency $\omega_{ps}(t)$ is twice the instantaneous frequency, namely $$\omega_{ps}(t) = 2\{\omega_i = +\Delta\omega\mu(t)\} \tag{9}$$

Figure 1:
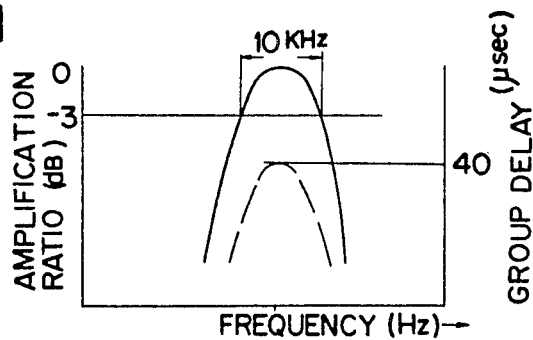
FIG. 1 is a diagram illustrating interrelations between amplification ratio or group delay and frequency of a surface acoustic wave amplifier.

If this relation is maintained, the output appearing at the output electrode 3—3 is not affected by the group delay so large as 40$\mu$ sec of FIG. 1, but is affected by merely several $\mu$ sec group delay determined by the velocity and the distance of a surface acoustic wave propagation. If the pumping frequency $\omega_{ps}(t)$ is deviated from the value of Equation (9), the output from the electrode 3—3 is phase distorted and gives a bad influence to the tracking action.

Figure 3:
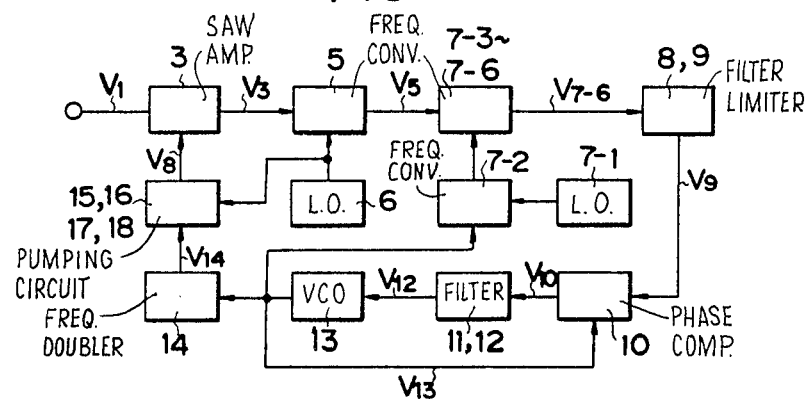
FIG. 3 is a block diagram which corresponds to but are more generally grouped than the block diagram of FIG. 2.

For a better understanding, FIG. 3 shows more generally grouped circuit elements of FIG. 2.

Figure 4:
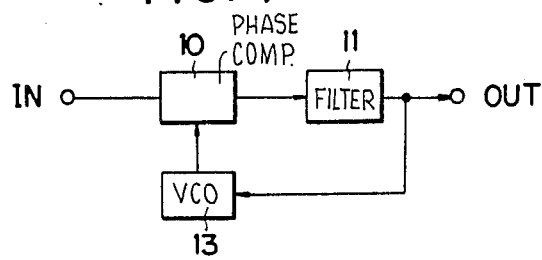
FIG. 4 is a block diagram of an essential FM demodulator of a PLL type.

In FIG. 3, the tracking action is effected by comparing voltages $v_9$ and $v_{13}$ in the phase comparator 10 and by controlling the VCO 13 with the resulting output of the comparison. This operation is equal to that of the FM demodulator utilizing the phase locked loop of FIG. 4.

For a proper operation of the system of FIG. 3, the phase modulated components (FM modulated components) of $v_9$ must be equal to $v_i$. If the relations are out of Equations (8) and (9), the SAW amplifier 3 produces a phase distortion. If the phase distorted output from the SAW amplifier 3 is applied to the phase comparator 10, the distorted components also appears in $v_{13}$ and sequently in $v_3$, so that the system constitutes a positive feedback loop which increases the distortion, and finally becomes incapable of reception.

Figure 5:
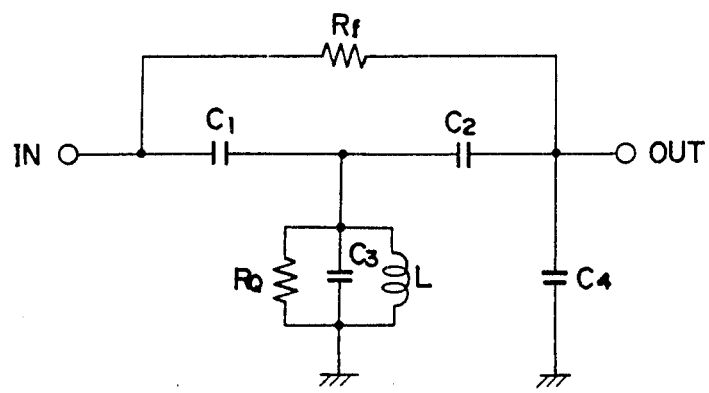
FIG. 5 is a circuit arrangement of an IF equalizer.
Figure 6:
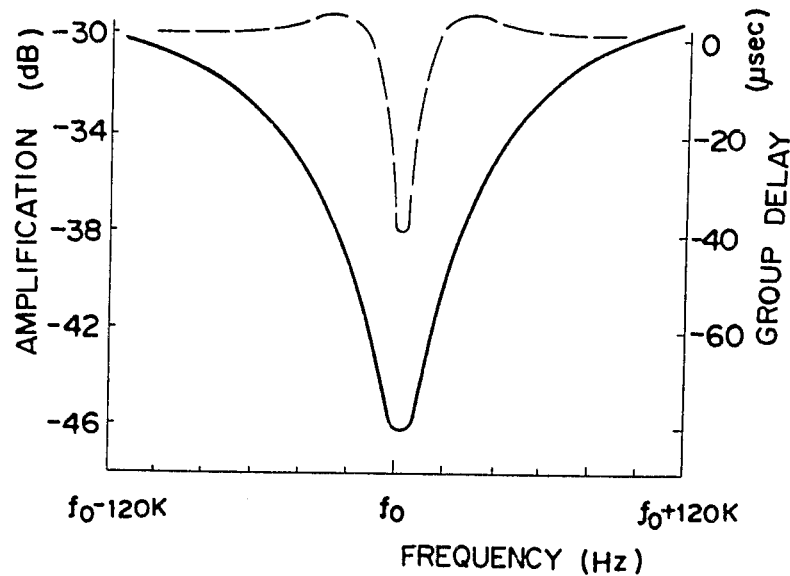
FIG. 6 is a diagram illustrating variations of amplification ratio and group delay with frequency.

The tracking equalizer 7 is required in this connection. The tracking equalizer 7 has frequency characteristics opposite to those of the SAW amplifier 3 both in amplitude and in phase (group delay) so as to cancel the distorted components of $v_3$. The tracking equalizer 7 is generally comprises two frequency converters 7-3 and 7-6 and the IF equalizer 7-4. The IF equalizer 7-4 may be composed of a notching filter of FIG. 5. In FIG. 5, capacities C1 and C2 having a small capacitance, 33 pF, for example. The notching frequency and the Q are determined by an inductor L, capacitor C3 and resistor RQ. Capacitor C4 prevents amplitude increases in the high frequency range. A resistor Rf prevents that the amplitude of the notching center frequency becomes extremely small. As shown in FIG. 6, the characteristics are substantially opposite to those of FIG. 1 both in amplitude with a solid line and in group delay with a dotted line. To drive the IF equalizer with the frequency of $v_{13}$, the frequency converters 7-3 and 7-6 are combined. Assume now that the instantaneous frequency of $v_{18}$ is expressed by $$\omega_{ps}(t) = 2\{\omega_i + \Delta\omega\mu(t) + \omega_e(t)\} \quad (10)$$

instead of Equation (9), the center freqnecy $\omega_o(t)$ of the SAW amplifier 3 is $$\omega_o(t) = \omega_i + \Delta\omega\mu(t) + \omega_e(t) \quad (11)$$

which is $\omega_e(t)$ higher than the input instantaneous frequency.

Next assume that $v_i$ is applied to the frequency converter 5. When the frequency of the first local oscillator 6 is $\omega_{Li}$, the instantaneous frequency $\omega_{IF1}(t)$ of the output $v_5$ from the frequency converter 5 is expressed by $$\omega_{IF1}(t) = \omega_i - \omega_{L1} + \Delta\omega\mu(t) \quad (12)$$
$$= \omega_{IF1} + \Delta\omega\mu(t)$$

The instantaneous frequency $\omega_{13}(t)$ of the output from the VCO 13 is $$\omega_{13}(t) = \omega_{IF1} + \Delta\omega\mu(t) + \omega_e(t) \quad (13)$$

and the instantaneous frequency of the output from the frequency converter 7-2 is $$\omega_{7\text{-}2}(t) = \omega_{IF1} - \omega_{L2} + \Delta\omega\mu(t) + \omega_e(t) \quad (14)$$

where the output frequency of the second local oscillator 7-1 is $\omega_{L2}$. Therefore, the instantaneous frequency $\omega_{7\text{-}3}(t)$ of the output from the frequency converter 7-3 is $$\omega_{7\text{-}3}(t) = \omega_{IF1}(t) - \omega_{7\text{-}2}(t) \quad (15)$$
$$= \omega_{L2} - \omega_e(t)$$

Since the center frequency of the IF equalizer 7-4 is $\omega_{L2}$, the input instantaneous frequency of the IF equalizer 7-4 is $\omega_e(t)$ lower than the center frequency. This is the same as in the case of the SAW amplifer. Since the relations between the center frequencies and the input instantaneous frequencies are equal and the frequency characteristics are opposite, additional amplitude- and phase-modulated components to the SAW amplifier 3 and the modulated components to the IF equalizer 7-4 are equal in magnitude and opposite in polarity. Namely, the output $v_3$ from the SAW amplifier is $$v_3 = A(\omega)e \times p[j\{\omega_i t + \theta_i(t) + \psi(\omega_e(t))\}] \quad (16)$$

where $\psi(\omega_e(t))$ is the additional phase modulated components corresponding to the error $\omega_e(t)$ The output $v_{7\text{-}4}$ from the IF equalizer is $$v_{7\text{-}4} = \frac{1}{A(\omega)} e \times p[j\{\omega_{L2}t - \int\omega_e(t)dt - \psi(\omega_e(t))\}] \quad (17)$$

and the output $v_{7\text{-}4}$ is frequency processed again together with the output $v_{7\text{-}2}$ by the frequency converter 7-6 into the output $v_{7\text{-}6}$ of the converter 7-6 as expressed by $$v_{7\text{-}6} = \frac{1}{A(\omega)} e \times p[j\{\omega_{IF1}(t) + \theta_i(t) - \psi(\omega_e(t))\}] \quad (18)$$

It will be noted that the amplitude modulated components of Equations (16) and (18) are inverse numbers, and the additional phase modulated components $\psi(\omega_e(t))$ are opposite polarities. By using transfer functions, the transfer function $H1(\omega, t)$ of the SAW amplifier 3 and the transfer function $H2(\omega, t)$ of the tracking equalizer 7 are expressed by $$H_1(\omega - \omega_i, t) = H_2^{-1}(\omega - \omega_{IF1}, t) \quad (19)$$

Since the output from the SAW amplifier 3 is converted to the center frequency $\omega_{IF1}$ by the frequency converter 5, the output $v_{7\text{-}6}(\omega, t)$ with $v_i(\omega, t)$ of FIG. 3 is expressed by $$v_{7\text{-}6}(\omega - \omega_{IF1}, t) = v_i(\omega - \omega_i, t) \quad (20)$$

This shows that $v_{7\text{-}6}$ is merely converted in center frequency from $v_i$ to $v_{IF1}$ but does not include additional amplitude or phase-modulated components, thus leading to a favourable tracking operation.

The aforegoing explanation does not considers the amplification ratio of the tuned type amplifier 7-5. It should be noted accordingly that $v_{7\text{-}6}$ is actually larger in amplitude than $v_i$.

Figure 7:
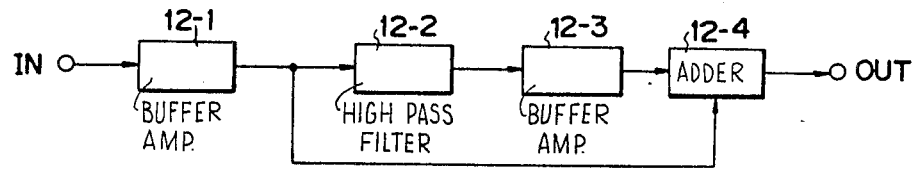
FIG. 7 is a block diagram of an AF equalizer.
Figure 8:
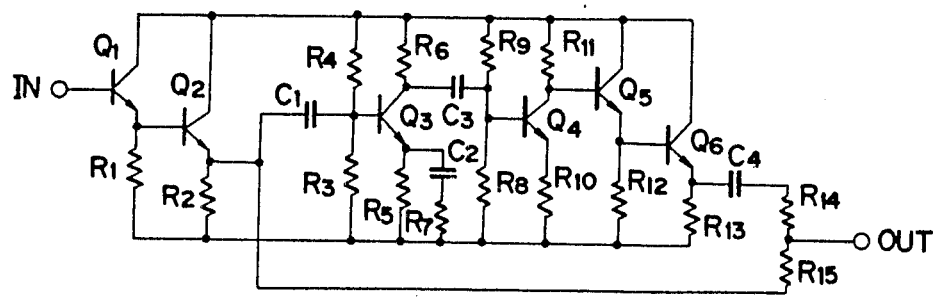
FIG. 8 is a circuit arrangement of the AF equalizer.
Figure 9:
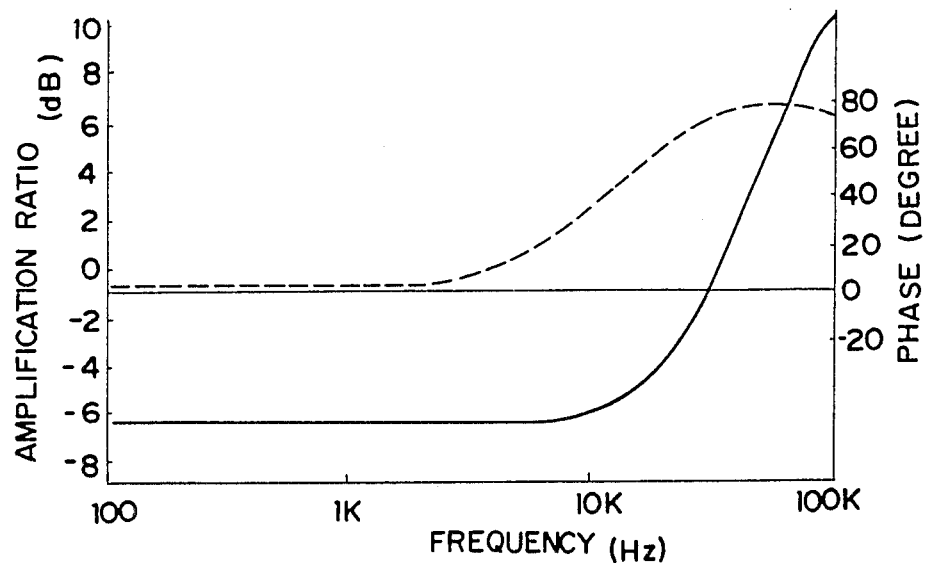
FIG. 9 is a diagram illustrating variations of amplification ratio and phase with frequency given by the circuit of FIG. 8.

The AF equalizer 12 will be explained hereunder. As shown in FIGS. 7 and 8, the AF equalizer 12 is adapted to add the input of the first line for all bands pass and the input of the second filter line and produces the resulting output. In the Figures, reference numeral 12-1 and 12-3 refer to buffer amplifiers, 12-2 refers to a high band filter and 12-4 refers to an adder. This circuit arrangement aims to obtain a negative group delay in the FM modulated frequency range. The group delay is expressed by $$\tau = \frac{d\phi(\omega)}{d\omega} \quad (21)$$

where $\phi(\omega)$ is the phase. So, it is understood from FIG. 9 that the group delay is negative upto 53 kHz approximately. In this Figure, the solid line represents the amplification ratio variation and the dotted line represents the phase variation. The negative group delay compensates the fixed delay time of the SAW amplifier and the delay times of the other circuit elements, thereby improving the tracking characteristics.

Figure 10:
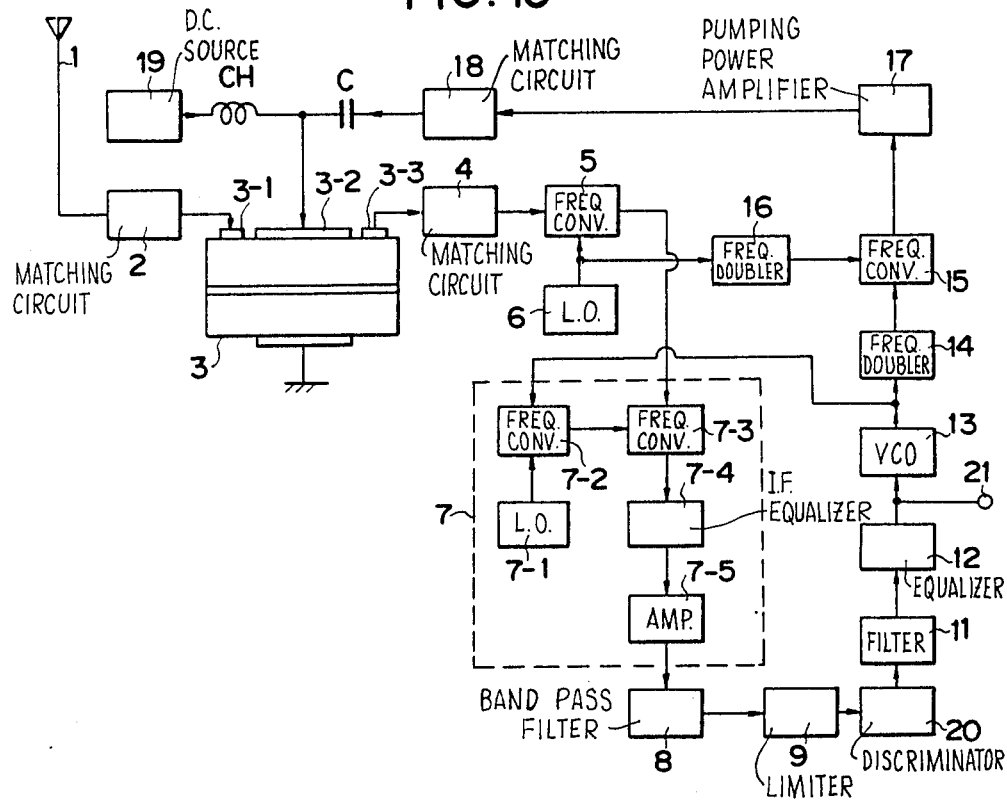
FIG. 10 is a block diagram of another receiver embodying the invention.

FIG. 10 is a block diagram which shows another receiver embodying the invention wherein the same reference numerals as those in FIG. 2 designate the same circuit elements, except reference numeral 20 which denotes a frequency discriminator. The system of FIG. 10 differs from that of FIG. 2 in the following respect:

(1) The tracking equalizer 7 does not include a frequency converter at the output side.

(2) The frequency discriminator 20 takes the place of the phase comparator 10.

Due to the difference (1), the center frequency of the block consisting of the band pass filter 8, limitter/amplifier 9 and frequency discriminator 20 is $f_{IF2}$ but not $f_{IF1}$.

The tracking action of the system of FIG. 10 is as follows.

The output $v_{7-4}$ from the IF equalizer 7-4 is expressed by $$v_{7-4} = e \times p[j\{\omega_{L2}t - \int \omega_e(t)\}] \qquad (22)$$

That is to say, the instantaneous frequency $\omega_{7-4}(t)$ of the output $v_{7-4}$ is expressed by $$\omega_{7-4}(t) = \omega_{L2} - \omega_e(t) \qquad (23)$$

Since with $\omega_e(t) \to 0$ a favourable tracking is effected, the $\omega_e(t)$ component can be used as the error voltage to control the VCO 13. The $\omega_e(t)$ component is extracted by the frequency discriminator 20.

The system of FIG. 10 is is advantageous in simplicity as compared to the system of FIG. 2.

As described above, the invention employs two equalizer circuits to compensate group delay characteristics of the SAW amplifier, thus improving the tracking characteristics, decreasing the distortion, and increasing the tracking range. Further, since only one of the SAW amplifier inputs is used, the circuit arrangement can be simplified.

The embodiments of the invention in which an exclusive property or privilege is claimed are defined as follows:

1. A receiver, comprising:
   surface acoustic wave amplifier means provided in a high frequency amplification stage for generating an output signal corresponding to a surface acoustic wave propagating on said surface acoustic wave amplifier means;
   phase locked loop demodulator means for demodulating said output signal from said surface acoustic wave amplifier means;
   a voltage controlled oscillator controlled by an output signal from said phase locked loop demodulator means, said voltage controlled oscillator producing an output signal having frequency modulated components;
   means responsive to said frequency modulated components of said output signal from said voltage controlled oscillator for producing a pumping signal which has frequency modulated components and is applied to a pumping input of said surface acoustic wave amplifier means; and
   frequency converter means for producing an output signal which is said output signal from said surface acoustic wave amplifier means frequency converted by said output signal from said voltage controlled oscillator, said output signal of said frequency converter means being applied to an input of an equalizer circuit which has transfer characteristics opposite to those of said surface acoustic wave amplifier means both in amplitude and in phase, an output signal from said equalizer circuit being applied to an input to said phase locked loop demodulator means.

2. A receiver, comprising:
   surface acoustic wave amplifier means provided in a high frequency amplification stage for generating an output signal corresponding to a surface acoustic wave propagating on said surface acoustic wave amplifier means;
   frequency discriminator means for demodulating said output signal from said surface acoustic wave amplifier means;
   a voltage controlled oscillator controlled by an output signal from said frequency discriminator means, said voltage controlled oscillator producing an output signal having frequency modulated components;
   means responsive to said frequency modulated components of said output signal from said voltage control oscillator for producing a pumping signal which has frequency modulated components and is applied to a pumping input of said surface acoustic wave amplifier means; and
   frequency converter means for producing an output signal which is said output signal from said surface acoustic wave amplifier means frequency converted by said output signal from said voltage controlled oscillator, said output signal of said frequency converter means being applied to an input of an equalizer circuit which has transfer characteristics opposite to those of said surface acoustic wave amplifier means both in amplitude and in phase, an output signal from said equalizer circuit being applied to an input to said frequency discriminator means.

3. A receiver as claimed in claim 1 or claim 2, wherein said equalizer circuit includes a trap circuit which rejects specific frequencies.

4. A receiver as claimed in claim 3, wherein said trap circuit includes an input terminal and an output terminal, two capacitors connected in series between said input and output terminals, a resonance circuit connecting a point between said capacitors to ground, a resistor connected between said input and said output terminals, and a capacitor connected between said output terminal and ground to bypass high frequency components.

5. A receiver as claimed in claim 1, wherein said output signal of said voltage controlled oscillator is applied to a further input of said phase locked loop demodulator means.

6. A receiver as claimed in claim 1, including a second equalizer circuit which is provided between and couples said phase locked loop demodulator means to said voltage controlled oscillator, said second equalizer circuit having an input terminal to which said output signal of said phase locked loop demodulator means is applied, an output terminal which is coupled to an input of said voltage controlled oscillator, a high pass filter having an input coupled to said input terminal, and an adder having a first input coupled to said input terminal and a second input coupled to an output of said high pass filter, said adder producing at an output thereof the sum of signals applied to said first and second inputs thereof, said output of said adder being coupled to said output terminal of said second equalizer circuit.

7. A receiver as claimed in claim 2, including a second equalizer circuit which is provided between and couples said frequency discriminator means to said voltage controlled oscillator, said second equalizer circuit having an input terminal to which said output signal of said frequency discriminator means is applied, an output terminal which is coupled to an input of said voltage controlled oscillator, a high pass filter having an input coupled to said input terminal, and an adder having a first input coupled to said input terminal and a second input coupled to an output of said high pass filter, said adder producing at an output thereof the sum of signals applied to said first and second inputs thereof, said output of said adder being coupled to said output terminal of said second equalizer circuit.

* * * * *